United States Patent
Kim et al.

(10) Patent No.: US 6,566,188 B2
(45) Date of Patent: May 20, 2003

(54) METHOD OF FORMING CONTACT HOLES IN SEMICONDUCTOR DEVICES AND METHOD OF FORMING CAPACITORS USING THE SAME

(75) Inventors: Dong Hyun Kim, Kyungki-do (KR); Bong Ho Choi, Seoul (KR); Yong Tae Cho, Kyungki-do (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/177,950

(22) Filed: Jun. 21, 2002

(65) Prior Publication Data
US 2002/0197813 A1 Dec. 26, 2002

(30) Foreign Application Priority Data
Jun. 21, 2001 (KR) .......................................... 2001-35569

(51) Int. Cl.[7] .......................................... H01L 21/8242
(52) U.S. Cl. ........................ 438/239; 438/253; 438/396
(58) Field of Search ........................... 438/3, 239, 240, 438/241, 253–256, 396–399

(56) References Cited

U.S. PATENT DOCUMENTS

| 5,200,358 | A | * | 4/1993 | Bollinger et al. ............ 438/586 |
| 5,314,843 | A | * | 5/1994 | Yu et al. ...................... 438/692 |
| 5,468,684 | A | * | 11/1995 | Yoshimori et al. ............. 438/3 |
| 6,015,733 | A | * | 1/2000 | Lee et al. ..................... 438/253 |
| 6,215,187 | B1 | * | 4/2001 | Ooto et al. .................. 257/516 |
| 6,335,241 | B1 | * | 1/2002 | Hieda et al. ................. 438/253 |

* cited by examiner

Primary Examiner—Ha Nguyen
Assistant Examiner—Jennifer M. Kennedy
(74) Attorney, Agent, or Firm—Marshall, Gerstein & Borun

(57) ABSTRACT

A method of manufacturing a capacitor of a semiconductor device. In order to reduce a vertical etching profile at a lower portion of a hole where a charge storage electrode, an impurity is doped into the interlayer insulating film wherein the difference in concentration of the impurity at a lower portion and at an upper portion of the interlayer insulating film is controlled to make the etching rate at the lower portion of the interlayer insulating film faster than that at the upper portion of the interlayer insulating film using a wet etching process. Therefore, the region where a lower electrode will be formed has a maximum width to prevent a decrease in the capacitance of the capacitor.

20 Claims, 4 Drawing Sheets

METHOD OF FORMING CONTACT HOLES IN SEMICONDUCTOR DEVICES AND METHOD OF FORMING CAPACITORS USING THE SAME

BACKGROUND

1. Technical Field

A method of forming a contact hole in a semiconductor device is disclosed, and more particularly, a method of manufacturing a capacitor in a semiconductor device is disclosed that prevents reduction of capacitance of the capacitor by improving the etching profile of the contact hole in which a charge storage electrode is formed.

2. Description of the Related Art

As the cell size of semiconductor devices is reduced, the height of the charge storage electrode must be increased in order to secure an acceptable capacitance. This problem is illustrated by reviewing a conventional method of manufacturing a capacitor.

FIGS. 1A and 1B are cross-sectional views of a semiconductor device. Referring now to FIG. 1A, a first interlayer insulating film 12 is formed on a semiconductor substrate 11 in which various components of a semiconductor device are formed through conventional processes. A given region of the first interlayer insulating film 12 is then etched to expose a junction region of the semiconductor substrate 11, thereby forming a first contact hole 100. Next, the first contact hole 100 is filled with a conductive material to form a charge storage electrode plug 13. After a second interlayer insulating film 14 is formed on the entire structure, a portion of the second interlayer insulating film 14 is removed to expose a charge storage electrode plug 13 by an etching process, thereby forming a second contact hole 200.

Currently, in order to secure an adequate capacitance of the capacitor, the height of the charge storage electrode must be high. As a result, the second interlayer insulating film 14 must be thick and, consequently, the process of forming the second contact hole 200 and the speed of removing the polymer generated upon etching becomes slower due to thickness of the interlayer insulating film 14. Further, the width of the lower portion of the second contact hole 200 is narrower than that of the upper portion of the second contact hole 200 resulting in an inclination face 15 at a lower portion of the second contact hole 200.

Referring now to FIG. 1B, a conductive material is deposited on the entire structure including the second contact hole 200. Next, a planarization process such as chemical mechanical polishing process is performed to remove the conductive material on top of the second interlayer insulating film 14, thus forming a charge storage electrode 16 within the second contact hole 200.

The charge storage electrode 16 has a V-shape which results in a reduced capacitance as opposed to when the charge storage electrode 16 has a vertical shape. Further, the contact area between the charge storage electrode plug 13 and the charge storage electrode 16 is reduced, thereby increasing the contact resistance. Therefore, the electrical characteristic of the capacitor is degraded.

SUMMARY OF THE DISCLOSURE

A method of forming a contact hole and a method of forming a capacitor in a semiconductor device capable of preventing a reduction in the capacitance of the capacitor are disclosed where an impurity is doped into an interlayer insulating film and a difference in the doping concentration at upper and lower portions of the interlayer insulating film is controlled so that the etching rate at the lower portion of the interlayer insulating film is faster than that at the upper portion thereby obtaining a contact hole having a vertical shape as opposed to the inclined shape discussed above which results in an increased capacitance of the capacitor.

In order to obtain the vertically-shaped contact hole, a method of manufacturing a capacitor in a semiconductor device is disclosed which comprises forming interlayer insulating films on a semiconductor substrate in which various components for forming the semiconductor device are formed by means of common processes and doping at least one of the interlayer insulating film so that the concentration of the impurity at a lower portion of the interlayer insulating film being doped is higher than that at an upper portion of the interlayer insulating film being doped; removing a given region of the doped interlayer insulating film by means of an etching process; performing a wet cleaning process; forming a conductive material on the entire structure; performing a planarization process to form a plurality of independent charge storage electrodes; and forming a dielectric film and an upper electrode on the entire structure.

The impurity is preferably phosphorous or boron. The insulating films are preferably BPSG or PSG.

The supplying of the impurity while the insulating film is formed can include supplying an amount of impurity for a second interlayer insulating film that is smaller than that supplied when the first lower insulating film is formed to form a second insulating film with an impurity concentration which is lower than that of the first insulating film, and reducing the amount of the impurity supplied when a subsequent insulating film is formed to form an insulating film with an impurity concentration that is lower than that of underlying insulating films, in order to form the interlayer insulating films of a desired thickness.

By doping lower portions of the insulating film with a higher concentration of dopant and by doping upper portions of the insulating film with lower concentrations of dopant, the lower portions of the film are less dense than the upper portions and, consequently, etch at a faster rate resulting in a more vertical etching profile and a capacitor with improved properties.

The wet cleaning process may be performed using BOE or HF solution being oxide-etching solution.

BRIEF DESCRIPTION OF THE DRAWINGS

The disclosed methods and resulting devices will be explained in the following description, taken in conjunction with the accompanying drawings, wherein.

DETAILED DESCRIPTION OF THE PRESENTLY PREFERRED EMBODIMENTS

Figure 1A:
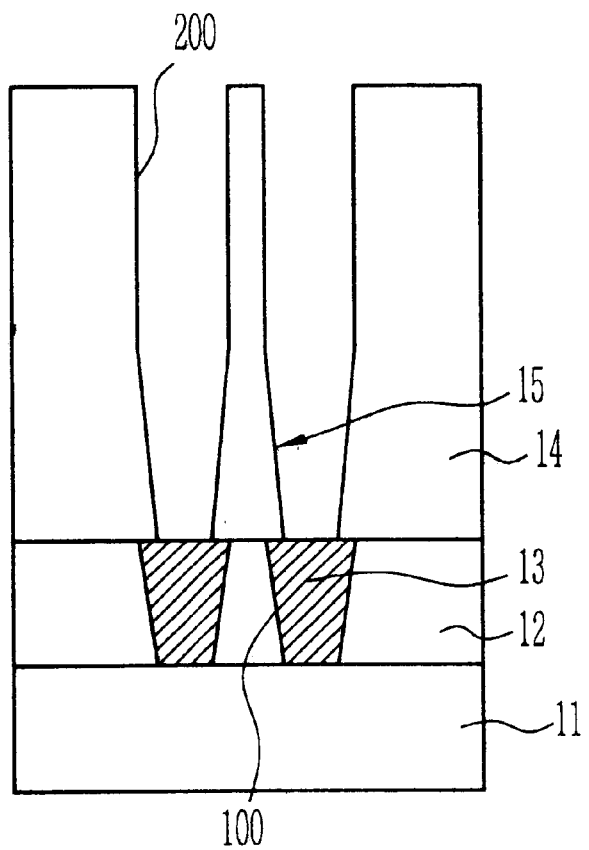
FIGS. 1A and 1B are cross-sectional views of a semiconductor device for explaining a conventional method of manufacturing a capacitor in a conventional semiconductor device.
Figure 1B:
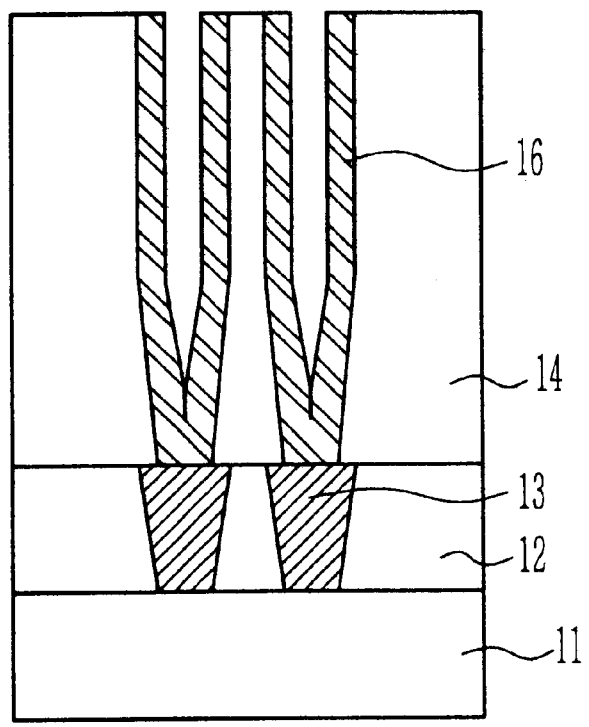

The disclosed methods and devices will be described in detail by way of preferred embodiments with reference to accompanying drawings, in which like reference numerals are used to identify same or similar parts.

FIGS. 2A to 2E are cross-sectional views of a semiconductor device for explaining a disclosed method of manufacturing a capacitor in a semiconductor device.

Figure 2A:
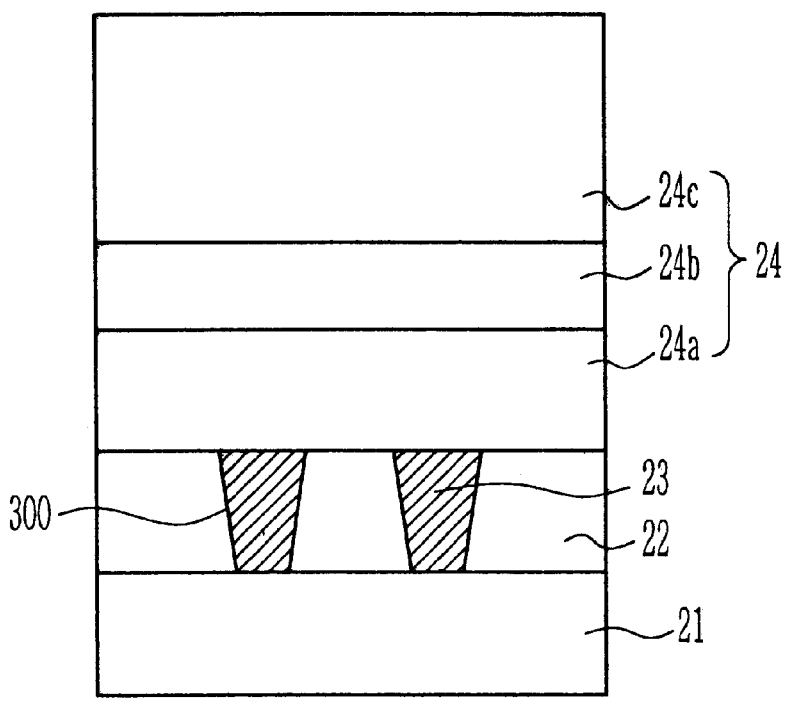
FIGS. 2A to 2E are cross-sectional views of a disclosed semiconductor device explaining a disclosed method of manufacturing a capacitor in the semiconductor device.

Referring now to FIG. 2A, a first interlayer insulating film 22 is formed on a semiconductor substrate 21 in which various components are also formed through common processes for the purpose of forming a completed semiconductor device. Given regions of the first interlayer insulating film 22 are then etched to expose a junction region of the semiconductor substrate 21 so that first contact holes 300 is formed. Next, first the contact holes 300 are filled with a conductive material to form charge storage electrode plugs 23. A second interlayer insulating film 24 is formed on the entire structure. An upper portion 24c of the second interlayer insulating film 24 is doped with a lower concentration of an impurity than middle portion 24b and lower portion 24a. The second interlayer insulating film 24 may comprise a single layer or may be formed of first, second and third insulating films or layers 24a, 24b and 24c as indicated in FIG. 2A to achieve the desired thickness.

The first, second and third insulating films or layers 24a, 24b and 24c are formed of a BPSG (boranophosphosilicate glass) film or a PSG (phosphosilicate glass) film. The first to third insulating films 24a to 24c all preferably include the impurity, respectively. At this time, the impurity concentration of the first insulating film 24a over the charge storage electrode plugs 23 is the highest and the impurity concentration of the third insulating film 24c is the lowest because the higher the dopant or impurity concentration, the faster the etch rate.

A method of doping the interlayer insulating film with the impurity will be below described.

Each of the insulating films 24a, 24b and 24c is formed by means of similar processes. In the process of forming the insulating film 24, an impurity such as phosphorous (P), boron (B) or mixtures thereof, is supplied so that the insulating film 24 can be doped with the impurity. At this time, the amount of the impurity supplied when the insulating film 24 is formed is controlled to control the doping level of each of the insulating films or layers 24a, 24b, 24c. In other words, the amount of the impurity supplied when the first insulating film 24a is formed is greater than when the second and third insulating films 24b and 24c are formed. The amount of the impurity supplied when the second insulating film 24b is formed smaller than when the first insulating film 24a is formed but greater than when the third insulating film 24c is formed. Also, the amount of the impurity supplied when the third insulating film 24c is formed smaller than when the second insulating film 24b is formed.

A method of doping each of the interlayer insulating films with an impurity will be below described taking another embodiment as an example.

Similarly, each of the insulating films 24a, 24b and 24c is formed through similar processes. Every time each of the insulating films 24a, 24b and 24c is formed, an impurity such as phosphorous (P) or boron (B) is implanted by means of impurity ion implantation process. When the impurity ion implantation process is performed for each of the insulating films 24a, 24b, 24c, the amount of the impurity is controlled to adjust the doping level of each of the insulating films 24a, 24b, 24c. In other words, the amount of the impurity implanted in the second and third insulating films 24b and 24c is less than the first insulating film 24a. Also, the amount of the impurity implanted in the second insulating film 24b is less than the first insulating film 24a but greater than the third insulating film 24c. Also, the amount of the impurity implanted in the third insulating film 24c is less than the second insulating film 24b.

The first to third insulating films 24a to 24c having different impurity concentration are preferably sequentially formed to form the second interlayer insulating film 24, is to increase the etching rate at the lower portion 24a than the upper portion 24c of the second interlayer insulating film 24 when a given region of the second interlayer insulating film 24 is etched.

Figure 2B:
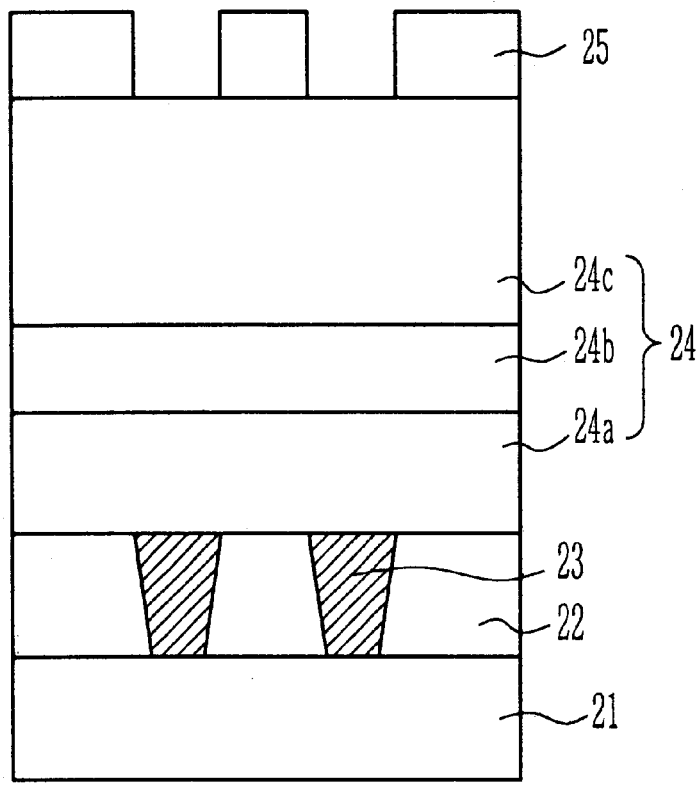

Referring now to FIG. 2B, a photoresist pattern 25 is formed on the second interlayer insulating film 24. Given regions of the second interlayer insulating film 24 is exposed by forming the photoresist pattern 25. A charge storage electrode of the capacitor will be formed in the exposed regions in a subsequent process.

Figure 2C:
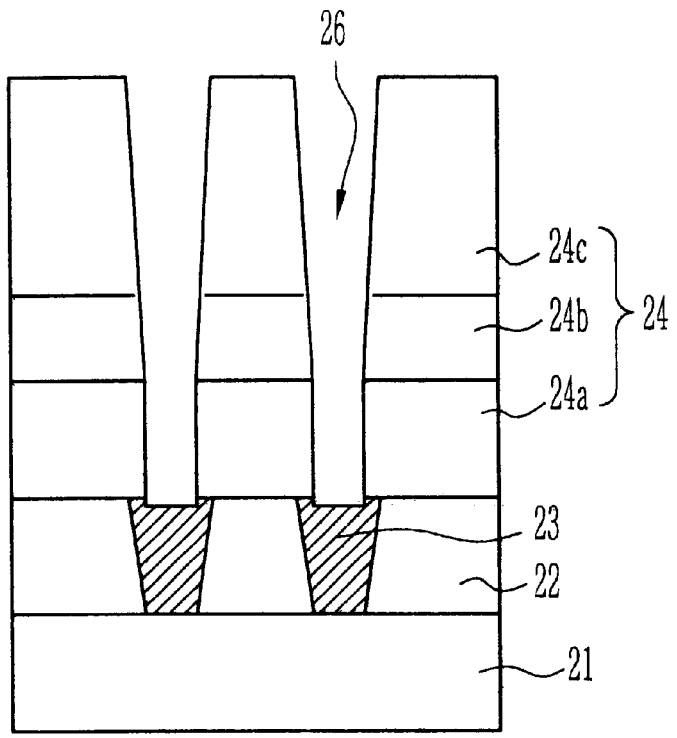

Referring now to FIG. 2C, the exposed regions of the second interlayer insulating film 24 are removed by means of an etching process using the photoresist pattern 25 as an etch mask, thereby forming second contact holes 26. An upper surface of the charge storage electrode plug 23 is exposed at the bottom of the second contact hole 26. Next, the photoresist pattern 25 is removed.

At this time, the amount of polymer generated when the insulating film 24 is etched varies by means of the difference in the doping level of the first to third insulating films 24a to 24c. Due to this, the etching profile at the lower portion of the second hole 26 becomes nearly vertical.

Figure 2D:
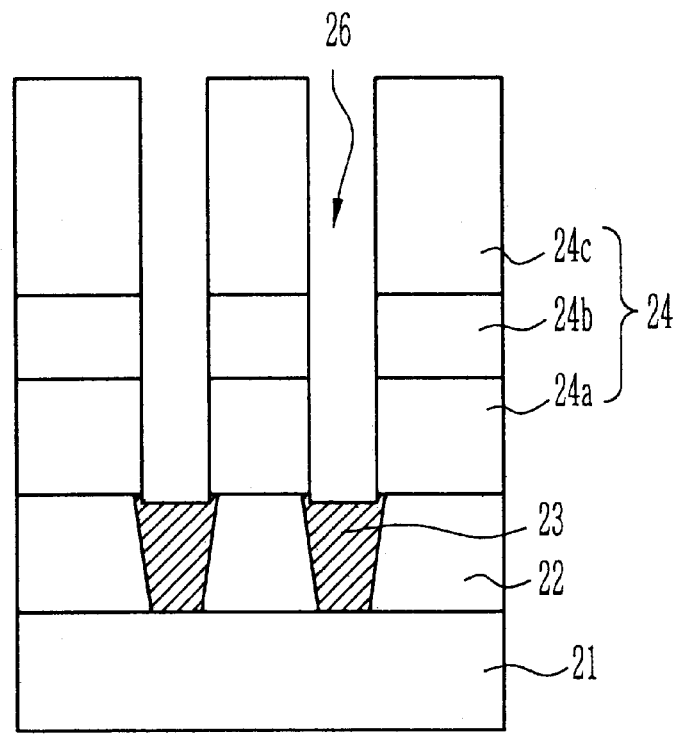

Referring now to FIG. 2D, a wet cleaning process is performed in order to remove remaining polymer, etc. generated upon the etching process for forming the second contact hole 26 or when the photoresist pattern 25 is removed.

At this time, the wet cleaning process is performed using a BOE (buffered oxide etchant) solution or a HF solution as an oxide etching solution. As the doping levels of the first to third insulating films 24a to 24c are different and the etching rate at the lower portion of the second contact hole 26 is faster than that at the upper portion of the second contact hole 26 using wet etching, the profile of the second contact hole 26 after the cleaning process is more vertical than after the etching process as shown in FIG. 2D. Generally, if the amount of the impurity such as phosphorous (P) or boron (B) is increased, the wet etching rate is further increased due to the lower density of the highly-doped regions as compared to the less doped regions.

Figure 2E:
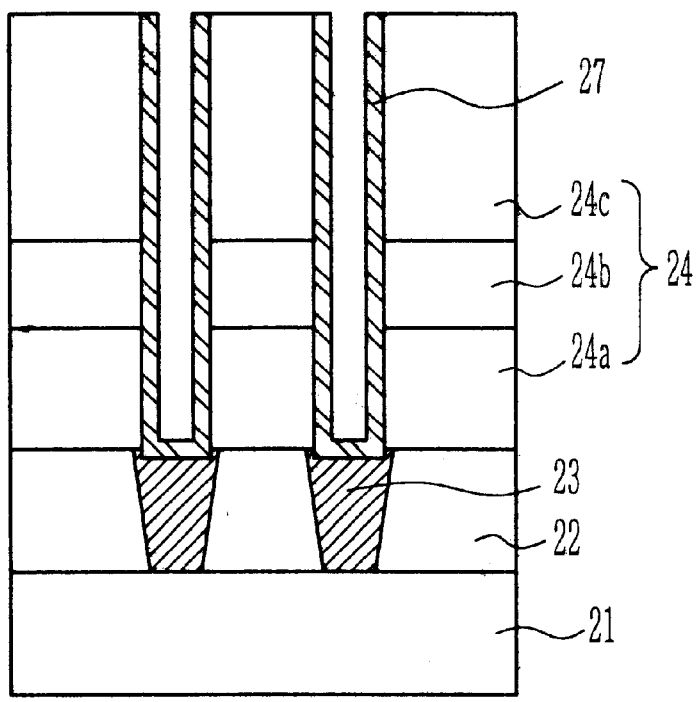

Referring now to FIG. 2E, the second contact holes 26 are formed at the given regions of the second interlayer insulating film 24 to expose the charge storage electrode plugs 23. Then, a conductive material (see 27 in FIG. 2E) is formed on the entire structure including the charge storage electrode plugs 23 and the second contact holes 26. Next, a planarization process such as chemical mechanical polishing process is performed to remove the conductive material on the second interlayer insulating film 24, thus a plurality of independent charge storage electrodes 27.

As the cross-sectional profile at the lower portion of the second contact hole 26 is rectangular, the lower electrode 23 is contacted by the electrode 27 at the bottom of the hole to prevent a decrease in the capacitance of the capacitor.

Thereafter, though not shown in the drawings, a dielectric film and an upper electrode are formed on the entire structure by means of common processes, thus completing the capacitor.

In the above, the second interlayer insulating film 24 is formed to have three (3) insulating films 24a to 24c. However, it should be understood that the second interlayer insulating film 24 could be formed to have two (2) or more insulating films or the N number of the insulating films depending on the aspect ratio of the hole or the process condition. The doping concentration is the highest at the lower portion of the first insulating film and becomes lower toward the upper portion of the insulating film. The doping concentration of the first to Nth insulating films constituting the upper interlayer insulating film can be arbitrarily controlled.

As mentioned above, the etching profile of a hole at a region where a charge storage electrode will be formed is vertical or substantially vertical, so that a region where the charge storage electrode will be formed can be secured by a maximum contact. Therefore, the disclosed methods and devices have outstanding advantages that they can prevent a decrease in the capacitance and improve reliability of the process.

The disclosed methods and devices have been described with reference to a particular embodiments in connection with a particular application. Those having ordinary skill in the art and access to the teachings of this disclosure will recognize additional modifications and applications within the scope thereof.

It is therefore intended by the appended claims to cover any and all such applications, modifications, and embodiments within the scope of this disclosure.

What is claimed is:

1. A method of manufacturing a capacitor of a semiconductor device, the method comprising:

forming an interlayer insulating film on the substrate, the interlayer insulating film having multiple doping levels, the multiple doping levels being obtained by controlling concentrations of an impurity during the formation of the interlayer insulating film so that a lower portion of the interlayer insulating film has a higher doping concentration than an upper portion of the interlayer insulating film;

forming contact holes by removing given regions of the interlayer insulating film using an etching process to generate vertical profiles at lower portions of each contact hole, each contact hole being tapered radially outwardly from its lower portion to its upper portion; and removing additional interlayer insulating film material from each contact hole by a wet cleaning process to create a vertical profile for each contact hole extending from the lower portion through the upper portion of each contact hole.

2. The method of claim 1, further comprising:

forming a layer of a conductive material on the entire structure including the contact holes after the wet cleaning process.

3. The method of claim 2, further comprising:

performing a planarization process to form a plurality of charge storage electrodes after forming the layer of conductive material.

4. The method of claim 3, further comprising:

forming a dielectric film and an upper electrode on the entire structure after the planarization process.

5. The method of claim 1, wherein the impurity is phosphorous (P) or boron (B).

6. The method of claim 1, wherein the interlayer insulating film comprises one of BPSG or PSG.

7. The method of claim 1, wherein the wet cleaning process is performed using a BOE (buffered oxide etchant) solution or a HF (oxide etching solution).

8. A method of manufacturing a capacitor of a semiconductor device, the method comprising:

sequentially forming a plurality of interlayer insulating films on the semiconductor substrate the plurality of interlayer insulating films having different concentrations of an impurity wherein the concentration of the impurity of a lower interlayer insulating film is greater than that of an upper interlayer insulating film;

forming holes by removing given regions of the plurality of interlayer insulating films using an etching process to generate vertical profiles at a lower portions of each contact hole, each contact hole being tapered radially outwardly from its lower portion to its upper portion; and;

removing additional interlayer insulating film material from each contact hole by a wet cleaning process to create a vertical profile for each contact hole extending from the lower portion through the upper portion of each contact hole.

9. The method of claim 8, further comprising:

forming a conductive material layer on the entire structure including the holes after the wet cleaning process.

10. The method of claim 9, further comprising:

removing part of the conductive material layer by performing a planarization process to form a plurality of charge storage electrodes.

11. The method of claim 10, further comprising:

forming a dielectric film and an upper electrode on the entire structure after the planarization process.

12. The method as claimed in claim 8, wherein said impurity is phosphorous (P) or boron (B).

13. The method as claimed in claim 5, wherein said interlayer insulating film comprises one of BPSG or PSG.

14. The method as claimed in claim 8, wherein the sequential forming of the interlayer insulating films further comprises:

forming a first interlayer insulating film and supplying the impurity having a first concentration;

forming a second interlayer insulating film and supplying the impurity having a second concentration lower than the first concentration; and forming a third interlayer insulating film and supplying the impurity having a third concentration lower than the second concentration.

15. The method as claimed in claim 8, wherein the sequential forming of the interlayer insulating films further comprises:

forming a first interlayer insulating film;

implanting the impurity in the first interlayer insulating film having a first concentration;

forming a second interlayer insulating film;

implanting the impurity in the second interlayer insulating film having a second concentration lower than the first concentration;

forming a third interlayer insulating film; and implanting the impurity in the third interlayer insulating film having a third concentration lower than the second concentration.

16. The method as claimed in claim 5, wherein the wet cleaning process is performed using at least one of a BOE solution or a HF solution as an oxide etching solution.

17. A method of forming a contact hole in a semiconductor device, comprising:

forming insulating films having an upper film and a lower film, in which an impurity concentration of the upper film is lower than that of the lower film;

performing an etching process to remove a portion of the insulating films so that a contact hole having a vertical profile through the lower film and an outwardly tapering profile through the upper film; and removing additional insulating film material from the portions of the upper film and from the lower film by performing a wet cleaning process to generate a vertical profile for the contact hole that extends through both the upper and lower films.

18. The method of claim 17, further comprising:
performing a wet etching process.

19. The method of claim 18, wherein the wet etching process is carried out using a BOE solution or a HF oxide etching solution.

20. The method of claim 18, wherein the impurity is phosphorus (P) or boron (B).

* * * * *